United States Patent [19]
Farquhar et al.

[11] Patent Number: 6,079,100
[45] Date of Patent: Jun. 27, 2000

[54] METHOD OF MAKING A PRINTED CIRCUIT BOARD HAVING FILLED HOLES AND FILL MEMBER FOR USE THEREWITH

[75] Inventors: Donald S. Farquhar, Endicott; Voya R. Markovich, Endwell; Kostas I. Papathomas, Endicott; Leonard L. Schmidt, Owego, all of N.Y.

[73] Assignee: International Business Machines Corporation, Armonk, N.Y.

[21] Appl. No.: 09/076,649

[22] Filed: May 12, 1998

[51] Int. Cl.[7] .................................. H01K 3/10; H01R 9/09
[52] U.S. Cl. ........................... 29/852; 29/846; 174/262; 174/265; 427/97
[58] Field of Search .................... 29/846, 852; 427/97; 174/262, 265

[56] References Cited

U.S. PATENT DOCUMENTS

| | | |
|---|---|---|
| 4,017,968 | 4/1977 | Weglin . |
| 4,319,708 | 3/1982 | Lomerson . |
| 4,704,791 | 11/1987 | Chellis et al. . |
| 4,791,248 | 12/1988 | Oldenettel . |
| 4,884,337 | 12/1989 | Choinski . |
| 4,967,314 | 10/1990 | Higgins, III . |
| 5,028,743 | 7/1991 | Kawakami et al. . |
| 5,117,069 | 5/1992 | Higgins, III . |
| 5,118,458 | 6/1992 | Nishihara et al. . |
| 5,224,265 | 7/1993 | Dux et al. . |
| 5,232,548 | 8/1993 | Ehrenberg et al. . |
| 5,271,150 | 12/1993 | Inasaka . |
| 5,288,665 | 2/1994 | Nulman . |
| 5,346,750 | 9/1994 | Hatakeyama et al. . |
| 5,450,290 | 9/1995 | Boyko et al. . |
| 5,451,722 | 9/1995 | Gregoire . |
| 5,487,218 | 1/1996 | Bhatt et al. . |
| 5,527,998 | 6/1996 | Anderson et al. . |
| 5,557,844 | 9/1996 | Bhatt et al. . |
| 5,571,593 | 11/1996 | Arldt et al. . |
| 5,662,987 | 9/1997 | Mizumoto et al. . |

*Primary Examiner*—Carl J. Arbes
*Attorney, Agent, or Firm*—Scully, Scott Murphy & Presser

[57] ABSTRACT

A method of making a circuitized substrate such as a printed circuit board having at least one hole therein which comprises the steps of providing a layer of dielectric, forming at least one (and preferably several) holes therein, positioning a thin layer of support material atop the dielectric layer and over the hole(s), positioning a quantity of fill material on the thin layer of support material (preferably before positioning the thin layer on the dielectric) and thereafter applying a predetermined force sufficient to cause the thin support layer to rupture or otherwise deform (including melting from heat application thereto) such that the fill material is forcibly driven into the accommodating hole(s). Subsequent steps can include forming a layer of circuitry on the substrate's external surface and over the filled holes such that an electrical component such as a ball grid array (BGA), semiconductor chip, etc. may be directly positioned on and/or over the hole(s). A fill member usable with the method is also provided.

25 Claims, 3 Drawing Sheets

METHOD OF MAKING A PRINTED CIRCUIT BOARD HAVING FILLED HOLES AND FILL MEMBER FOR USE THEREWITH

CROSS-REFERENCE TO COPENDING APPLICATIONS

In Ser. No. (Ser. No.) 08/672,292, filed Jun. 28, 1996 and entitled "Manufacturing High Density Computer Systems With Circuit Board Assemblies Having Filled Vias Free From BleedOut" (inventors A. Bhatt et al), there is described a circuit board structure and method for making same wherein fill material is positioned (e.g., using injection or heat and pressure) in holes (called "vias") in the board's substrate. A laminate peel-apart structure is used, in addition to one or more photoresist patterns which may be formed.

The following patent applications have also been filed from Ser. No. 08/672,292 following a restriction requirement:

Ser. No. 09/030,587, filed Feb. 25, 1998;
Ser. No. 09/033,456, filed Mar. 2, 1998;
Ser. No. 09/033,617, filed Mar. 3, 1998;
Ser. No. 09/021,772, filed Mar. 10, 1998;
Ser. No. 09/041,845, filed Mar. 12, 1998.

TECHNICAL FIELD

This invention relates to the manufacture of printed circuit boards and particularly to methods for making such boards wherein at least one and preferably several through holes are provided in the board, e.g., for providing interconnections with internal conductive planes or even to circuitry located on an opposite side of the board.

BACKGROUND OF THE INVENTION

As is known, many current printed circuit board constructions require one or more external conductive layers, e.g., circuitry and/or pads for mounting components thereon, and, given today's increased functional demands, a plurality of internal conductive planes, e.g., signal, power and/or ground. To provide effective interconnections between components and the board's conductive circuitry and pads, the use of through holes has been adopted wherein several such holes are passed through the board and electrically coupled in a selective manner to internal and external conductive elements. Such holes typically include a conductive, e.g., copper, layer as part thereof which in turn contacts the also typically copper circuitry and pads.

By the term "through hole" or simply "hole" as used herein is meant to include both conductive and non-conductive apertures which may extend entirely through the circuit board and only partly therethrough (such holes are often called "vias" in the art), including between only one or more internal layers without being externally exposed. Examples of various circuit board structures which include the use of holes of these types are defined in several published documents, including the following U.S. Letters Patents, issued on the dates identified:

U.S. Pat. No. 4,704,791—Chellis et al—Nov. 10, 1987
U.S. Pat. No. 5,450,290—Boyko et al—Sep. 12, 1995
U.S. Pat. No. 5,487,218—Bhattetal—Jan. 30, 1996
U.S. Pat. No. 5,557,844—Bhatt et al—Sep. 24, 1996
U.S. Pat. No. 5,571,593—Arldt et al—Nov. 5, 1996
U.S. Pat. No. 5,662,987—Mizumoto et al—Sep. 2, 1997

All of these patents are assigned to the same assignee as the present invention and are incorporated herein by reference.

Circuit boards of the aforementioned type are particularly adapted for having one or more (usually several) electrical components, e.g., semiconductor chips, capacitors, resistors, etc., mounted on an external surface thereof and coupled to various, selected internal conductive planes within the board's dielectric substrate. As demands for increased levels of integration in semiconductor chips and other electrical components continue, parallel demands call for concurrent increased functional capabilities, e.g., increased circuit densities, in printed circuit boards adapted for use with such components. Such demands further emphasize the growing need for more closely spaced electrical components on the board's outer surfaces. For those boards possessing greater functional capabilities and therefore which use several through holes therein, it is highly desirable to position the electrical components directly over the holes to maximize board real estate while assuring a compact, miniaturized final board product.

The above demands are particularly noteworthy when it is desirable to couple what are referred to as ball grid array (BGA) components directly onto the board's outer conductive layer(s). Such components include a plurality of highly dense conductors, e.g., solder ball elements, closely positioned in a fixed pattern on the component's undersurface. Such is also the case for directly mounted semiconductor chips (also known as direct chip attach or DCA components) wherein a dense pattern of several minute solder balls are arranged on the chip's compact and extremely small undersurface (that directly facing the underlying circuit board). To successfully accommodate such components, filling of the board's holes with conductive material (called "fill") has been tried, with one or more examples defined in the above-identified issued Letters Patents. To accomplish such filling, however, it is typically necessary to utilize a mask or the like with pre-formed, e.g., drilled or punched, apertures therein which coincide with the desired hole pattern. Once provided in the necessary precise alignment, various filler materials have been attempted, including both electrically conductive and non-conductive. One example of such a filler is defined in U.S. Pat. No. 5,487,218, wherein the composition is an organic polymeric material with an optional particular filler added thereto to modify the thermal and/or electrical properties of the composition. One excellent reason for such modification is to approximately match the coefficients of thermal expansion of both board substrate material and contained filler.

It is believed that a new and unique method of making a printed circuit board having at least one (and possibly several) holes therein which can be filled in a more expeditious manner than heretofore described would represent a significant advancement in the art. It is further believed that a printed circuit board produced in accordance with such a method would also constitute a significant art advancement, as would a fill member usable during the method for providing expeditious hole fill.

OBJECTS AND SUMMARY OF THE INVENTION

It is, therefore, a primary object of the present invention to enhance the art of printed circuit board manufacture by providing a new and unique method of making such a board wherein filled holes are used.

It is another object of the invention to provide such a method which can be performed in an expeditious manner adaptable for mass production, thereby reducing the costs of making such a board end product.

It is an even more particular object of the invention to provide such a method which can be successfully accomplished without the need for a mask or the like having preformed openings therein which must necessarily align with the already formed board hole pattern.

It is a still further object to provide a fill member that can be effectively used during circuit board manufacturing to assure precise and expeditious filling of the board's formed holes.

These and other objects are met by the present invention which defines a method for making a circuitized substrate (one prime example being a printed circuit board) which comprises the steps of providing a layer of dielectric material, forming at least one hole within the layer of dielectric material, positioning a thin layer of support material on the layer of dielectric material and over the at least one hole, positioning a quantity of fill material on the thin layer of support material, and applying a predetermined force onto the quantity of fill material sufficient to deform the thin layer of support material and cause at least some of the fill material to substantially fill the at least one hole.

In accordance with another aspect of the invention, there is provided a fill member for use in filling holes in a circuitized substrate. The fill member comprises a first thin layer of support material, a quantity of fill material on the thin layer of support material and a second thin layer of support material on the quantity of fill material, thus forming a "sandwich" with the fill material contained between two support layers.

BEST MODE FOR CARRYING OUT THE INVENTION

For a better understanding of the present invention, together with other and further objects, advantages and capabilities thereof, reference is made to the following disclosure and appended claims in connection with the above-described drawings.

In FIGS. 1–7, there are illustrated various steps for making a circuitized substrate (e.g., a printed circuit board) in accordance with the preferred teachings of the present invention. It is to be understood that a key feature of this invention involves the provision of a circuitized substrate having a plurality of through-holes therein wherein said holes are filled with an appropriate quantity of fill material (including electrically conductive or non-conductive) so that additional circuitry or other conductive elements (e.g., pads) may be formed on the top of such filled holes to thereby increase the availability of the substrate's total real estate.

Figure 1:
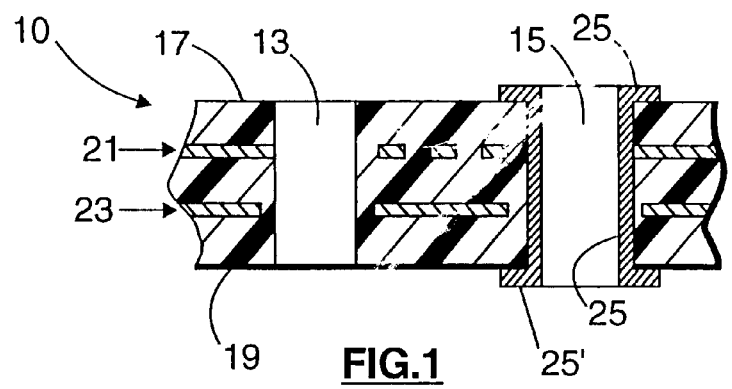
FIGS. 1–7 illustrate the various steps of performing the present invention, in accordance with a preferred embodiment thereof.

In FIG. 1, there is shown a multi-layered dielectric member 10 which includes a plurality of layers of dielectric material which, when laminated, form a substantially singular dielectric structure as shown. Member 10 is shown to include two holes 13 and 15 therein, which extend from the member's upper surface 17 to the undersurface 19. Member 10 preferably includes a pair of internal conductive planes 21 and 23 which may function as signal, power or ground members in the final structure. In the embodiment shown in FIG. 1, member 10 includes only two planes (21, 23) and two holes (13, 15), but it is understood that the invention is not limited to these examples in that in the broadest aspect of the invention, only one hole is needed in combination with one layer of conductive circuitry either on the top or bottom surfaces of member 10.

The internal conductive planes are preferably of copper and the multi-layered structure shown is preferably made using conventional lamination processes wherein individual layers of dielectric and conductive material are stacked and laminated. Further description is not believed necessary for this known procedure.

Holes 13 and 15 which, as stated above, may extend entirely through the dielectric member or between any two or more adjacent conductive planes, including extending only a relatively short distance within the dielectric member from upper surface 17. These holes are preferably formed in the laminated structure by drilling, punching or laser ablation. In the example depicted, hole 13 is shown as not including any conductive material on its internal surfaces, while hole 15 is of the more conventional type of such holes and includes a thin conductive layer 25, e.g., copper, on the internal walls as well as forming external lands 25' of the substrate's outer surfaces that substantially surround the hole at these two locations. The conductive layer 25 (including lands 25' if formed) is preferably applied using a known plating operation, and further description is not believed necessary.

The preferred dielectric material for member 10 is known fiberglass-reinforced epoxy resin (also known as "FR4"), but other materials, e.g., polytetrafluoroethylene, may be utilized. In one example, a dielectric member having a total of two internal conductive planes, a total of about 1,000 holes per square inch of one of member 10's two external surfaces, and an overall thickness of about 0.020 inch may be formed. Again, however, the invention is not limited to these particular values or numbers.

Figure 2:
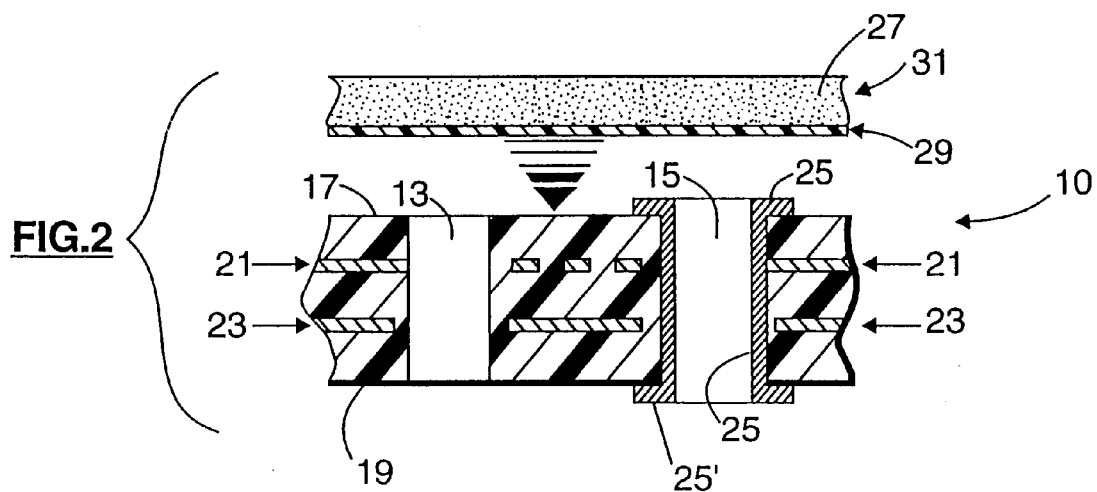

In FIG. 2, a quantity of fill material 27 positioned on a thin layer 29 of support material is lowered onto the upper surface 17 of member 10. In a preferred embodiment, the fill material is preferably positioned on the support layer 29 prior to positioning the resulting subassembly 31 atop member 10. This is not meant to limit the invention, however, in that the thin layer 29 may be initially positioned on surface 17 and the fill material 27 thereafter positioned on this supporting layer. In one example, the thin support layer is comprised of polyethylene with the fill material being conductive copper paste. In such an example, the support layer may possess a thickness of only about 0.0005 inch and the paste material an initial thickness of about 0.005 inch, thus providing an overall subassembly 31 thickness of about 0.0055 inch. Polyethylene represents an excellent choice of materials for use in the invention because of its relatively low melting temperature (about 127° Celsius). An alternative material is polytetrafluoroethylene, having a higher melting point of about 327° C. (Please see more below.)

Figure 3:
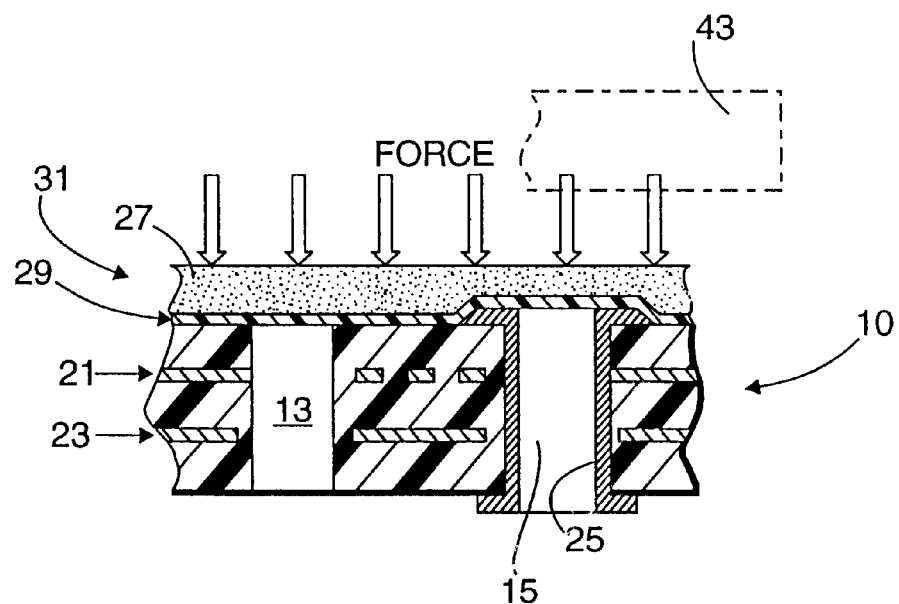
Figure 4:
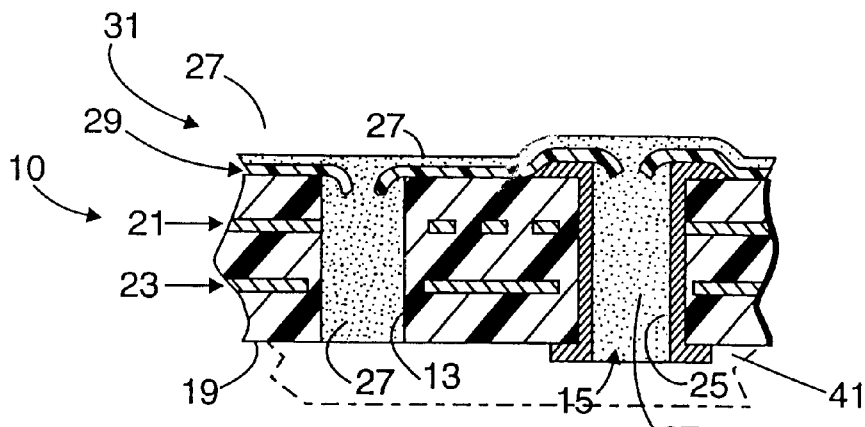

In FIG. 3, with subassembly 31 in position, a predetermined force is applied (as indicated by the six directional arrows) onto the fill material 27 which, as shown in FIG. 4, is sufficient to cause the underlying support material 29 to deform and allow at least some of the fill material within the previously covered holes 13 and 15. The preferred procedure for accomplishing such deformation is to utilize known lamination procedures, and, in one specific example of the invention, the dielectric member 10 and subassembly 31 were laminated at a pressure of from about 200 pounds per square inch (p.s.i.) to about 400 p.s.i. In a specific example, a pressure of about 300 p.s.i. was utilized. Such lamination occurred within a predetermined temperature range of from about 155° C. to about 215° C. In the foregoing specific example wherein the member and subassembly were subjected to a pressure of about 300 p.s.i., such a procedure was conducted at a temperature of about 185° C.

Most surprisingly, as a result of the aforementioned application of force, the relatively thin support material conveniently ruptured (as seen in FIG. 4) to allow fill dispersion into holes 13 and 15. Significantly, because the polyethylene material of the support layer is a relatively nonstick material with respect to the exposed surfaces shown, it is able to subsequently separate from the dielectric member (FIG. 5) in a relatively easy manner. The application of such pressure and heat softens the fill material 27 to thereby enhance fill dispersion into the receiving holes. Notably, at such temperature, which is above the polyethylene's melting point, the support layer 29 may melt in the area of holes 13 and 15, even further enhancing fill material dispersion. Should the higher melting point material polytetrafluoroethylene be used, it will not melt at such temperatures but will fracture (as mentioned below).

Other acceptable materials for support layer 29 include other polymers and may even include electrically conductive materials such as copper or aluminum. It is even further possible to utilize a waxed paper or the like, provided said material is weak enough in the area of the provided throughholes so as to allow rupture as shown herein.

As understood from the above, the deformation of support layer 29 may result in two different phenomena occurring. Specifically, the support layer may fracture or similarly break under the foregoing temperatures and pressures. It is also possible that through the appropriate application of heat for a predetermined time period prior to and during force application, and using the appropriate relatively low melting point support material, the force application may in turn result in a melting or similar deformation of the support layer in the region of holes 13 and 15.

As seen in FIG. 4 (and partially in FIG. 5), the compressed fill material 27 assumes a much thinner configuration as a result of the aforedefined force application. As further seen in FIG. 4, member 10 is preferably positioned on a suitable support structure (e.g., base 41), shown in phantom. Base 41, if used, is preferably comprised of a polymeric material such as polytetrafluoroethylene. With further attention to FIG. 3, it is possible to utilize another means for forced application onto paste material 27 than to use the defined lamination process. For example, it may be possible to apply this force using a substantially planar member 43 (shown in phantom in FIG. 3) which engages the paste material's upper surface when the member 10 and subassembly 31 are heated to a predetermined temperature, such as those above. Additionally, it is possible to heat the pressure plate member 43 to these temperatures during force application.

Figure 5:
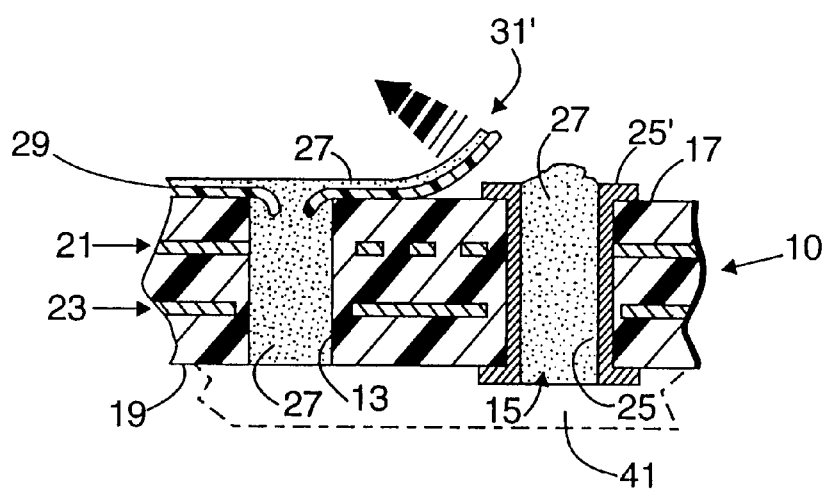

In FIG. 5, the support layer—compressed fill material subassembly 31' (that being only that part of same located on the member's upper surface 17) is removed. Notably, if polyethylene or similar low melting point material is used for layer 29, said material has re-solidified prior to such removal. This removal is preferably accomplished utilizing a stripping or similar peeling operation but may also be accomplished by other suitable means (e.g., a mechanical grinder or the like). As stated above, such removal is enhanced as a result of the substantial non-stickiness of the support material 29 with respect to upper surface 17. As also seen in FIG. 3, this support material is removed from the internal surfaces of the previously covered openings as a result of this removal process.

Figure 6:
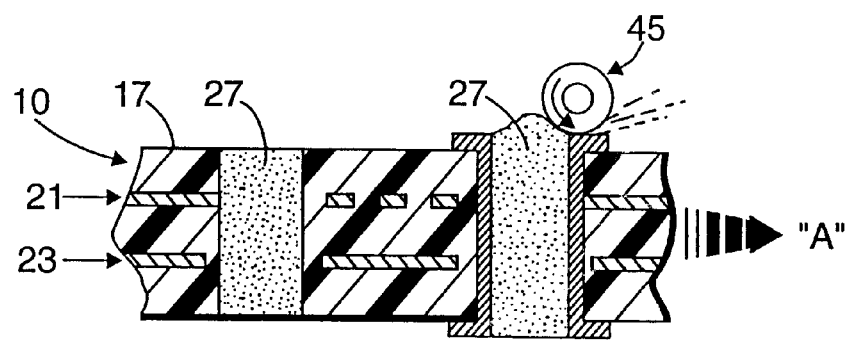

In FIG. 6, an optional grinding step may be performed utilizing a mechanical grinder 45 which moves over the member's top surface 17 or, alternatively, remains fixed in position with the underlying member moving thereunder (e.g., in direction "A"). This step may include simply grinding away any excessive fill material 27 (shown projecting above land 25') to form a planar land-fill structure. This step may further include partial grinding of the land 25 copper material so as to assure planarity thereof as well. Such grinding is within the knowledge of one of ordinary skill in the art and further description is not believed necessary.

Figure 7:
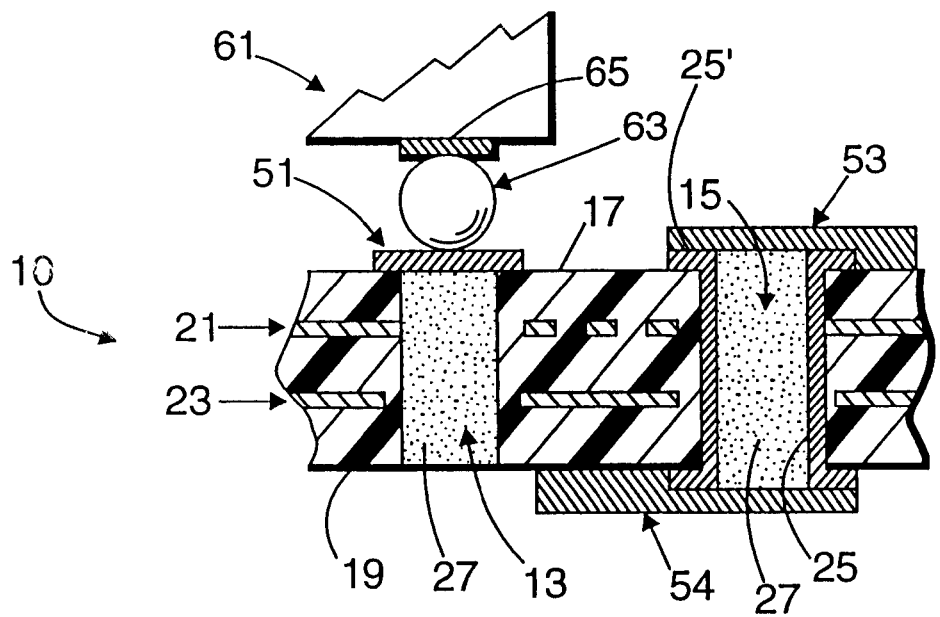

In FIG. 7, conductive members 51 and 53 are positioned over the upper exposed surface of the fill material 27 within holes 13 and 15 (and the top surface of land 25'), the formed fill material able to provide adequate support therefore. In a preferred embodiment, the conductive members 51 and 53 were provided by a plating operation known in the art and further description is not believed necessary. In such an example, member 51 represents a conductive pad, while member 53 may comprise a circuit line which in turn is coupled to another pad (not shown). Additionally, it is also possible to form one or more conductive members 54 on the undersurface 19 of member 10 (and on the lower land's external surface), thus even further increasing the available real estate for the finished circuitized substrate. Such conductive member 54 may also comprise a pad or line or the like structure, and in turn be electrically coupled to another electrical component (not shown).

In FIG. 7, an electrical component 61 (e.g., a semiconductor chip) is positioned atop conductive member 51 and electrically coupled thereto using a suitable conductive structure. In a preferred embodiment, this conductive structure is preferably a solder ball, one example of which may comprise 63:37 tin:lead solder. The solder ball in turn is electrically coupled to a conductive site 65 of the chip. It is, of course, understood that the invention is readily adaptable to having conductive elements such as semiconductor chips having several solder balls or the like for coupling the chip to the underlying circuitized substrate formed in accordance with the teachings herein. In one example, it is possible to effectively couple a semiconductor chip having 1000 contact sites onto selected ones of the substrate's conductor pads or similar structures, which, as described, are adapted for receiving the chip's solder balls. It is also within the scope of the invention to couple other electrical components to the substrate as formed in accordance with the teachings herein. Examples of such components may include resistors, capacitors, etc., several of which are known in the art. Such components may include projecting metallic leads or the like instead of solder balls as shown in FIG. 7. The invention is thus readily adaptable to use with several different types of components and in several different environments.

The preferred method of providing conductive members 51, 53 and 54 is to use a plating operation, several of which are known in the art. In one example, electroplating was utilized and conductive members having a thickness of only about 0.0005 inch were formed on the opposing surfaces of member 10.

In FIG. 7, it is seen that a conductive path is thus provided between conductor 51 to the first internal plane 21, provided the fill material 27 is an electrically conductive paste such as mentioned above. In the case of the other hole 15, a conductive path is formed from conductive member 53 to the first conductive plane 21 and further to the second conductive member 54. In this embodiment, it is understood that a non-conductive fill material 27 may be utilized because the internal conductive laser 25 of hole 15 provides such electrical connection. Although internal conductive layer 23 is not shown as being electrically coupled to either hole 13 or 15, this layer is shown in a representative manner only to illustrate that more than one such internal conductive layers may be utilized. It is, of course, understood that layer 23 may be directly connected to one or both of holes 13 and 15, and therefore, possibly electrically coupled to layer 21 and/or conductive members 53 and 54. Several other circuit combinations are possible within the scope of this invention and further description is not believed necessary.

Figure 8:
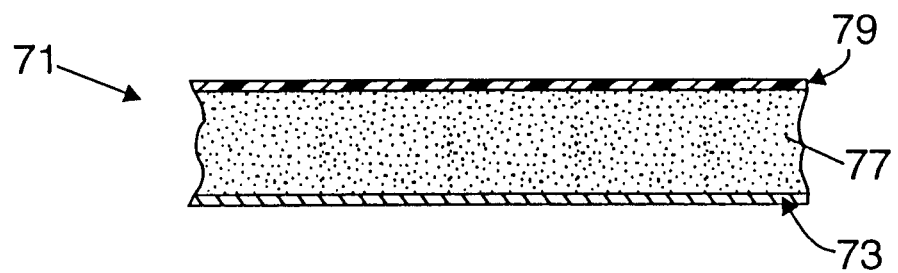
FIG. 8 illustrates a fill member in accordance with one embodiment of the invention.

In FIG. 8, there is shown a fill member 71 in accordance with a preferred embodiment of the invention. In this example, fill member 71 comprises a first thin support layer 73, a quantity of fill material 77 and a second, thin layer 79, also of support material. Opposing support layers 73 and 79 may be comprised of polymer material (e.g., polytetrafluoroethylene), a suitable thin metallic material (e.g., aluminum and copper) or, in the case of support layer 29, waxed paper. Layers 73 and 79 may each be of a thickness of from about 0.00025 inch to about 0.002 inch and, as shown in FIG. 8, may be of different materials (including where one is electrically conductive and the other a non-conductor).

The preferred fill material 77 is a low thermally expansive paste (e.g., copper paste) but other fill materials are possible. Examples of such other fill materials for use in the embodiment of FIGS. 1–7, include epoxies filled with silica, alumina, aluminum nitride, zinc oxide, boron nitride, magnesium, clay, silicate, etc., as well as non-filled epoxies and cyanate epoxy blends. The fill, using the aforementioned support layer thicknesses, may have a thickness of about 0.001 inch to about 0.005 inch. These fills can also be electrically conductive, if appropriate. By low thermal expansive is meant an expansion rate approximately the same as that of the dielectric member (in the out-of-plane direction).

The fill member of FIG. 8 is preferably utilized as a source of fill material in circuitized substrates such as those mentioned herein. As such, the member 71 is positioned atop a dielectric/conductive member such as member 10 and both components then subjected to lamination or similar application of heat and pressure such that the layer 73 or 79 in direct contact with the underlying substrate will deform in accordance with the teachings provided herein. As stated, it is thus possible to position fill member 71 with either layer 73 or 79 on the underlying substrate such that said layer fully covers one or more of the substrate's holes.

Surprisingly, it was discovered that utilization of the above-defined teachings resulted in substantially no fill material "bleed" when compared to similar processes using masks (e.g., drilled copper material) atop the underlying substrate and having preformed apertures therein through which fill material is pressed. Hole fill was also consistent over a variety of hole sizes having internal diameters ranging from about 0.008 inch to about 0.050 inch. The present invention thus represented a significant advancement over earlier procedures wherein formed masks were required.

Thus there has been shown and described a method of making a circuitized substrate and a fill member for use in such a method wherein the substrate's holes are quickly filled with desired fill material and the remaining (external) portion of the fill member is readily removable. Subsequent processing (e.g., circuitization) is also readily possible atop the filled holes to thus increase the operational current densities for the resulting end product (e.g., a printed circuit board having one or more semiconductor chips mounted thereon).

While there have been shown and described what are at present considered the preferred embodiments of the invention, it will be obvious to those skilled in the art that various modifications made be made therein without departing from the scope of the invention as defined by the appended claims.

What is claimed is:

1. A method of making a circuitized substrate, said method comprising:

providing a layer of dielectric material;

forming at least one hole within said layer of dielectric material wherein said at least one hole is provided in said layer of dielectric material using a process selected from the group of processes consisting of drilling, punching and laser ablation;

forming an electrically conductive layer on said at least one hole within said layer of dielectric material;

positioning a thin layer of support material on said layer of dielectric material and over said at least one hole;

positioning a quantity of fill material on said thin layer of support material following said positioning of said thin layer of support material on said layer of dielectric material; and applying a predetermined force onto said quantity of fill material while said quantity of fill material is subjected to a predetermined pressure and temperature sufficient to deform said thin layer of support material wherein said thin layer of said support material is ruptured in the area of said at least one hole as a result of said applying of said predetermined force and cause at least some of said fill material to substantially permanently fill said at least one hole.

2. The method of claim 1 wherein said electrically conductive layer is formed using a plating operation.

3. The method of claim 1 wherein said force application comprises a lamination process.

4. The method of claim 1 wherein said predetermined temperature is within the range of from about 155° C. to about 215° C.

5. The method of claim 4 wherein said predetermined temperature is about 185° C.

6. The method of claim 4 wherein said predetermined pressure is within the range of from about 200 p.s.i. to about 400 p.s.i.

7. The method of claim 6 wherein said predetermined pressure is about 300 p.s.i.

8. The method of claim 1 further comprising removing said thin layer of support material and said quantity of fill material that does not substantially fill said at least one hole from said layer of dielectric material.

9. The method of claim 8 further comprising the step of providing a conductive member atop said fill material substantially filling said at least one hole.

10. The method of claim 9 wherein said conductive member is provided using a plating operation.

11. The method of claim 9 further including electrically coupling an electrical component to said conductive member atop said fill material.

12. The method of claim 1 wherein said thin layer of said support material melts in the area of said at least one hole as a result of said applying of said predetermined force.

13. A fill member for use in permanently filling holes in a circuitized substrate through the application of a predetermined force while subjected to a predetermined pressure and temperature, said fill member comprising:

a first thin layer of support material;

a quantity of fill material consisting of a low thermally expansive copper paste on said thin layer of support material; and a second thin layer of support material on said quantity of fill material.

14. The fill member of claim 13 wherein said first thin layer of support material is comprised of a polymer material.

15. The fill member of claim 14 wherein said polymer material is polyethylene.

16. The fill member of claim 14 wherein said first thin layer has a thickness of from about 0.00025 inch to about 0.002 inch.

17. The fill member of claim 13 wherein said first thin layer is comprised of metallic material.

18. The fill member of claim 17 wherein said metallic material is selected from the group consisting of copper and aluminum.

19. The fill member of claim 13 wherein said first thin layer is comprised of waxed paper.

20. The fill member of claim 13 wherein said fill material has a thickness of from about 0.001 inch to about 0.005 inch.

21. The fill member of claim 13 wherein said second thin layer of support material is comprised of a polymer material.

22. The fill member of claim 21 wherein said polymer material is polyethylene.

23. The fill member of claim 21 wherein said second thin layer has a thickness of from about 0.00025 inch to about 0.002 inch.

24. The fill member of claim 13 wherein said second thin layer is comprised of metallic material.

25. The fill member of claim 13 wherein said metallic material is selected from the group consisting of copper and aluminum.

* * * * *